(12) United States Patent
Wang et al.

(10) Patent No.: US 11,855,327 B2
(45) Date of Patent: Dec. 26, 2023

(54) MEMS PHASE SHIFTER AND MANUFACTURING METHOD THEREOF

(71) Applicants: BEIJING BOE SENSOR TECHNOLOGY CO., LTD., Beijing (CN); BOE TECHNOLOGY GROUP CO., LTD., Beijing (CN)

(72) Inventors: Ying Wang, Beijing (CN); Jie Wu, Beijing (CN); Liang Li, Beijing (CN); Cuiwei Tang, Beijing (CN); Haocheng Jia, Beijing (CN); Xue Cao, Beijing (CN); Tienlun Ting, Beijing (CN); Chuncheng Che, Beijing (CN); Hao Liu, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 270 days.

(21) Appl. No.: 17/286,558

(22) PCT Filed: Sep. 15, 2020

(86) PCT No.: PCT/CN2020/115273
§ 371 (c)(1),
(2) Date: Apr. 19, 2021

(87) PCT Pub. No.: WO2021/088519
PCT Pub. Date: May 14, 2021

(65) Prior Publication Data
US 2022/0311112 A1    Sep. 29, 2022

(30) Foreign Application Priority Data

Nov. 7, 2019  (CN) .......................... 201911082335.1

(51) Int. Cl.
*H01P 1/18*   (2006.01)
*B81B 7/02*   (2006.01)
*H01P 11/00*  (2006.01)

(52) U.S. Cl.
CPC ................ *H01P 1/182* (2013.01); *B81B 7/02* (2013.01); *H01P 11/00* (2013.01); *B81B 2203/0323* (2013.01)

(58) Field of Classification Search
CPC ... B81B 7/02; B81B 2203/0323; H01P 1/182; H01P 11/00; H01P 1/184; H01P 1/18
See application file for complete search history.

(56) References Cited

U.S. PATENT DOCUMENTS 7,583,169 B1 * 9/2009 Scardelletti ............. H01P 1/127
                                                      333/262
9,941,560 B2 * 4/2018 Sarabandi ............... H01P 3/006
(Continued)

FOREIGN PATENT DOCUMENTS

CN        1728448 A    2/2006
CN      101159345 A    4/2008
(Continued)

OTHER PUBLICATIONS

"First Office Action and English language translation", CN Application No. 201911082335.1, dated Jun. 2, 2021, 27 pp.
(Continued)

*Primary Examiner* — Andrea Lindgren Baltzell
*Assistant Examiner* — Kimberly E Glenn
(74) *Attorney, Agent, or Firm* — Myers Bigel, P.A.

(57) ABSTRACT

The present disclosure provides a MEMS phase shifter and a manufacturing method thereof. The MEMS phase shifter includes a first substrate having a first surface, a coplanar waveguide on the first surface of the first substrate and including a first conductive wire and two second conductive (Continued)

wires on two sides of the first conductive wire and insulated from the first conductive wire, and a plurality of capacitance bridges on a side of the coplanar waveguide away from the first substrate. The plurality of capacitance bridges are arranged at intervals and insulated from the first conductive wire and the second conductive wire, and each of the plurality of capacitance bridges intersects the first conductive wire. The first surface of the first substrate includes a first groove, and the first conductive wire is suspended above the first groove.

13 Claims, 6 Drawing Sheets

(56) References Cited

U.S. PATENT DOCUMENTS

| | | | |
|---|---|---|---|
| 2005/0178646 | A1 | 8/2005 | De Los Santos |
| 2009/0134953 | A1 | 5/2009 | Hunt et al. |

FOREIGN PATENT DOCUMENTS

| | | |
|---|---|---|
| CN | 101246981 A | 8/2008 |
| CN | 101454873 A | 6/2009 |
| CN | 101572334 A | 11/2009 |
| CN | 101694896 A | 4/2010 |
| CN | 103746157 A | 4/2014 |
| CN | 105788971 A | 7/2016 |

OTHER PUBLICATIONS

"International Search Report and English language translation", International Application No. PCT/CN2020/115273, dated Dec. 15, 2020, 5 pp.

Shi, Yanling , "Non-official translation: Research on the Transmission Characteristics of Silicon-Based Coplanar Waveguide and Uses Thereof in Microwave Phase Shifters", Chinese Doctoral Dissertations & Master's Theses Full-text Database, Information Science, No. 2, chapter 5.3, Jun. 15, 2004, 220 pp.

* cited by examiner

MEMS PHASE SHIFTER AND MANUFACTURING METHOD THEREOF

RELATED APPLICATIONS

The present application is a 35 U.S.C. 371 national stage application of PCT International Application No. PCT/CN2020/115273, filed on Sep. 15, 2020, which claims the benefit of Chinese Patent Application No. 201911082335.1 filed on Nov. 7, 2019, the entire disclosure of which is incorporated herein by reference.

TECHNICAL FIELD

The present disclosure relates to the technical field of microwave devices, specifically to an MEMS phase shifter and a manufacturing method thereof.

BACKGROUND

In an MEMS phase shifter, signals are usually transmitted in the upper air and the lower substrate. The loss of signal in a substrate medium is much larger than the loss in the air medium, which causes a large dielectric loss of the transmission line. In addition, an MEMS phase shifter is usually packaged by methods such as fusion bonding, anode bonding, eutectic bonding, glass bonding, and thermocompression bonding. For example, a package cap is bonded on the substrate of an MEMS phase shifter for packaging. The substrate bonding packaging method easily introduces stresses that affect the phase shift, resulting in phase shift errors and further loss.

SUMMARY

According to an aspect of the present disclosure, there is provided an MEMS phase shifter, including: a first substrate having a first surface; a coplanar waveguide being located on the first surface of the first substrate, and including a first conductive wire and two second conductive wires that are located on two sides of the first conductive wire respectively and insulated from the first conductive wire: and a plurality of capacitance bridges being located on a side of the coplanar waveguide away from the first substrate, the plurality of capacitance bridges being arranged at intervals and insulated from the first conductive wire and the second conductive wires, and each of the plurality of capacitance bridges being disposed in an intersecting manner with the first conductive wire, wherein the first surface of the first substrate includes a first groove, and the first conductive wire is suspended above the first groove.

In some embodiments, the MEMS phase shifter further includes a plurality of support portions being located in the first groove and configured to support the first conductive wire.

In some embodiments, each of the plurality of support portions is integrated with the first substrate.

In some embodiments, an orthographic projection of each of the plurality of capacitance bridges on the first surface overlaps a respective one of orthographic projections of the plurality of support portions on the first surface.

In some embodiments, a portion of the first conductive wire that is in contact with the support portion has a first width, a portion of the first conductive wire that is located between any two adjacent support portions of the plurality of support portions has a second width, and the first width is greater than the second width.

In some embodiments, an orthographic projection of each of the plurality of capacitance bridges on the first surface is located between orthographic projections of two adjacent support portions of the plurality of support portions on the first surface.

In some embodiments, a portion of the first conductive wire that is in contact with the plurality of support portions has a third width, a portion of the first conductive wire that is located between any two adjacent support portions of the plurality of support portions and does not overlap an orthographic projection of any one of the plurality of capacitance bridges on the first surface has a fourth width, and a portion of the first conductive wire that overlaps the orthographic projection of each of the plurality of capacitance bridges on the first surface has a fifth width; the third width is greater than the fourth width, and the fourth width is greater than the fifth width.

In some embodiments, in a plane parallel to the first surface, a width of the first groove in a direction perpendicular to the first conductive wire is 3-6 times the fourth width.

In some embodiments, the MEMS phase shifter further includes an insulating layer disposed on the second conductive wires, wherein each of the plurality of capacitance bridges includes a first end portion, a second end portion, and an intermediate portion therebetween, and the first end portion and the second end portion are disposed on the insulating layer.

In some embodiments, the MEMS phase shifter further includes a second substrate disposed opposite to the first substrate, wherein the second substrate has a second surface facing the first substrate, the second surface includes a second groove, and the intermediate portion of each of the plurality of capacitance bridges is disposed in the second groove.

In some embodiments, orthographic projections of the first groove, the first conductive wire, and the second conductive wires on the first surface extend along a first direction, orthographic projections of the plurality of capacitance bridges on the first surface extend along a second direction, and the second direction is perpendicular to the first direction.

According to an aspect of the present disclosure, there is provided a method of manufacturing an MEMS phase shifter, including: providing a first substrate having a first surface; forming a coplanar waveguide on the first surface of the first substrate, the coplanar waveguide including a first conductive wire and two second conductive wires located on two sides of the first conductive wire respectively and insulated from the first conductive wire; forming a first groove on the first surface of the first substrate, the first conductive wire being suspended above the first groove; forming a plurality of capacitance bridges above the first substrate, the plurality of capacitance bridges being arranged at intervals and insulated from the first conductive wire and the second conductive wire, and each of the plurality of capacitance bridges being disposed in an intersecting manner with the first conductive wire.

In some embodiments, forming a coplanar waveguide on the first surface of the first substrate includes: forming a first metal layer on the first surface of the first substrate; patterning the first metal layer to form the first conductive wire and the two second conductive wires.

In some embodiments, forming a first groove on the first surface of the first substrate includes: coating a protective layer on the first surface of the first substrate; patterning the protective layer so that a patterned protective layer only covers the first conductive wire and the two second conductive wires; etching a portion of the first surface of the first substrate that is not covered by a protective stack formed by the patterned protective layer, the first conductive wire and the second conductive wires to form the first groove.

In some embodiments, etching a portion of the first surface of the first substrate that is not covered by a protective stack formed by the patterned protective layer, the first conductive wire and the second conductive wires to form the first groove includes: selectively etching a portion of the first surface of the first substrate that is not covered by the protective stack to form the first groove and a plurality of support portions in the first groove for supporting the first conductive wire.

In some embodiments, prior to forming the plurality of capacitance bridges above the first substrate, the method further includes: forming an insulating layer on the two second conductive wires.

In some embodiments, forming a plurality of capacitance bridges above the first substrate includes: providing a second substrate having a second surface; forming a second groove on the second surface of the second substrate; forming a plurality of capacitance bridges arranged at intervals on the second surface of the second substrate; assembling the second substrate with the first substrate with the first surface facing the second surface, wherein each capacitance bridge includes a first end portion, a second end portion, and an intermediate portion therebetween, the first end portion and the second end portion are located on the insulating layer, and the intermediate portion is located in the second groove.

In some embodiments, forming a plurality of capacitance bridges arranged at intervals on the second surface of the second substrate includes: forming a second metal layer on the second surface of the second substrate; patterning the second metal layer to form a plurality of capacitance bridges arranged at intervals.

In some embodiments, forming a plurality of capacitance bridges above the first substrate includes: forming the plurality of capacitance bridges so that an orthographic projection of each of the plurality of capacitance bridges on the first surface overlaps a respective one of orthographic projections of the plurality of support portions on the first surface.

In some embodiments, forming a plurality of capacitance bridges above the first substrate includes: forming the plurality of capacitance bridges so that an orthographic projection of each of the plurality of capacitance bridges on the first surface is located between orthographic projections of two adjacent support portions of the plurality of support portions on the first surface.

BRIEF DESCRIPTION OF THE DRAWINGS

In order to more clearly illustrate the technical solutions in embodiments of the present disclosure, the drawings to be used for description of the embodiments will be briefly introduced below. Obviously, the drawings described below are only some embodiments of the present disclosure. A person having an ordinary skill in the art may also obtain other drawings based on these drawings without spending inventive efforts.

DETAILED DESCRIPTION

The technical solutions in embodiments of the present disclosure will be described clearly and comprehensively below in conjunction with the drawings in the embodiments of the present disclosure. Obviously, the described embodiments are only part of the embodiments of the present disclosure, rather than all of them. All other embodiments obtained by a person having an ordinary skill in the art based on the embodiments of the present disclosure without spending inventive efforts fall within the protection scope of the present disclosure.

Figure 1:
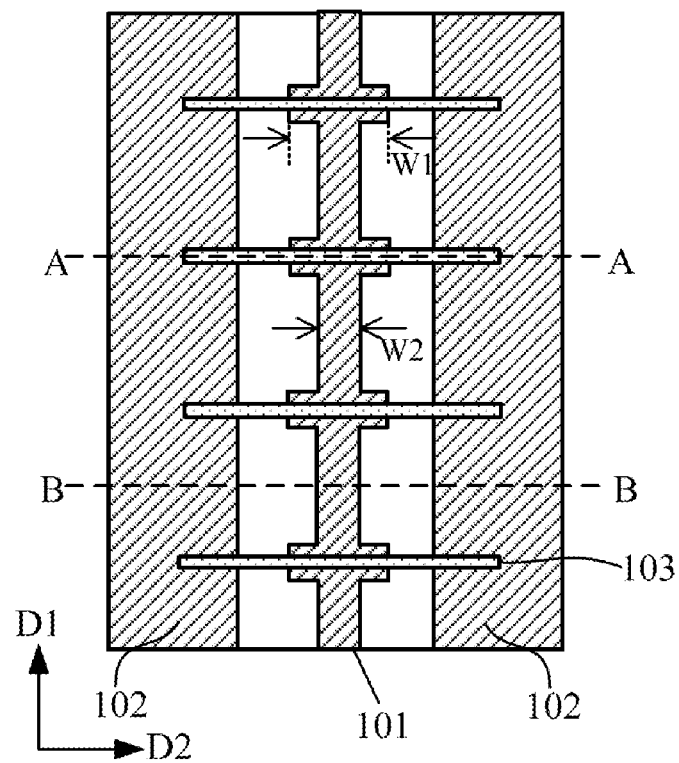
FIG. 1 is a schematic top view of an MEMS phase shifter according to an embodiment of the present disclosure.
Figure 4:
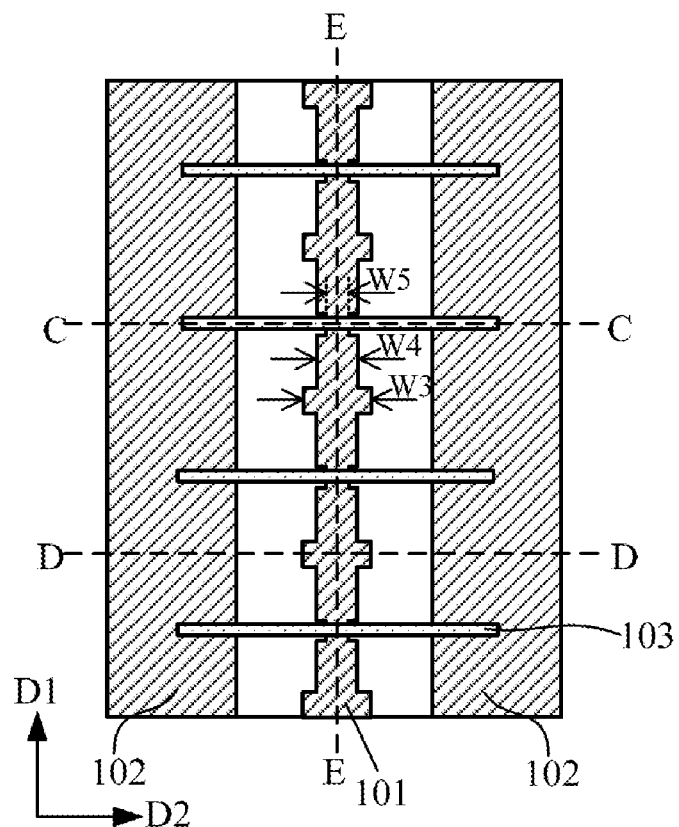
FIG. 4 is a schematic top view of another MEMS phase shifter according to an embodiment of the present disclosure.

According to an aspect of the present disclosure, there is provided an MEMS phase shifter. FIG. 1 and FIG. 4 are schematic top views of an MEMS phase shifter according to an embodiment of the present disclosure. Referring to FIG. 1 and FIG. 4, the MEMS phase shifter includes: a first substrate 100, which has a first surface; a coplanar waveguide, which is located on the first surface of the first substrate 100, and includes a first conductive wire 101 and two second conductive wires 102 located on two sides of the first conductive wire 101 respectively and insulated from the first conductive wire 101; and a plurality of capacitance bridges 103, which are arranged at intervals and insulated from the first conductive wire 101 and the second conductive wires 102, and each of the plurality of capacitance bridges 103 is disposed in an intersecting manner with the first conductive wire 101. The first surface of the first substrate 100 includes a first groove, and the first conductive wire 101 is suspended above the first groove.

The operating principle of the MEMS phase shifter is explained in brief below. Capacitance bridges 103 with a high capacitance ratio is periodically provided on a coplanar waveguide transmission line formed by the first conductive wire 101 and the second conductive wires 102, thereby increasing a distributed capacitance between the coplanar waveguide transmission line and the ground. This makes the coplanar waveguide transmission line a slow-wave system, which functions to achieve a phase delay. Applying a DC bias voltage on the coplanar waveguide transmission line can change the distributed capacitance, which results in changes in the parameters of the coplanar waveguide transmission line, thereby changing the phase of the electromagnetic wave. The width of the capacitance bridge 103 and the magnitude of the period interval determine the impedance of the coplanar waveguide transmission line, the transmission phase velocity and the Bragg, reflection cutoff frequency.

In case no control voltage is applied, the MEMS phase shifter is in an on state, and the suspended portion of the capacitance bridge 103 is not subjected to an electrostatic force and has an on-state capacitance Con. In case a control voltage is applied, the MEMS phase shifter switches from an on state to an off state, and the suspended portion of the capacitance bridge 103 descends under the effect of an electrostatic force and has an off state capacitance Goff, which causes an increase in the load capacitance value. This effect keeps increasing in the coplanar waveguide transmission line per unit length, and the distributed capacitance and transmission characteristic of the load on the coplanar waveguide transmission line change accordingly. Therefore, the phase velocity and characteristic impedance change, and the change in the phase velocity results in a phase shift. The magnitude of the phase shift is determined by the capacitance ratio Coff/Con of the capacitance bridge and the capacitance of the coplanar waveguide transmission line itself.

In some embodiments, as shown in FIGS. 1 and 4, the orthographic projections of a first groove 104, the first conductive wire 101 and the second conductive wires 102 on the first surface of the first substrate extend along a first direction D1, the orthographic projections of the plurality of capacitance bridges 103 on the first surface of the first substrate extend in a second direction D2, and the second direction D2 is perpendicular to the first direction D1.

Figure 3:
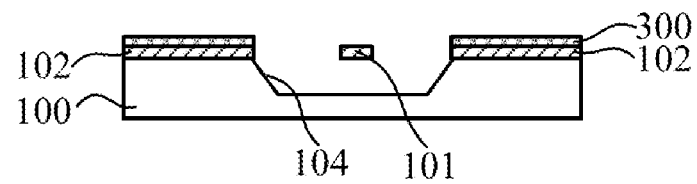
FIG. 3 is a schematic sectional view of the MEMS phase shifter in FIG. 1 taken along line BB.
Figure 5:
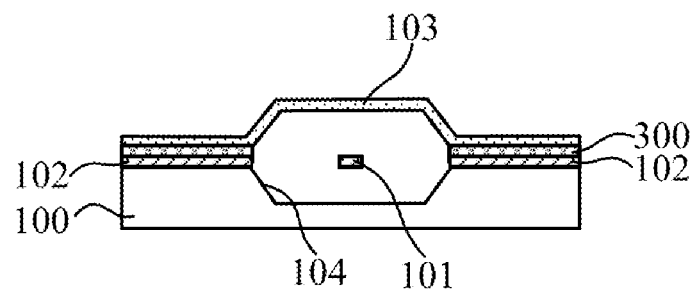
FIG. 5 is a schematic sectional view of the MEMS phase shifter in FIG. 4 taken along line CC.

FIG. 3 is a schematic sectional view of the MEMS phase shifter in FIG. 1 taken along line BB, and FIG. 5 is a schematic sectional view of the MEMS phase shifter in FIG. 4 taken along line CC. In some embodiments, the material of the first substrate 100 may be silicon. In the embodiments shown in FIGS. 3 and 5, the first groove 104 schematically has a cross-sectional shape such as an inverted trapezoid. The cross-sectional shape is determined by the anisotropic etching characteristic of silicon of the first substrate 100 in case chemical etching is used. Of course, the first substrate may also employ other materials, such as quartz, or compound semiconductors such as GaAs and GaN. Different processes can be used to obtain grooves of different shapes on different materials, which is not limited in the present disclosure.

The materials of the first conductive wire, the second conductive wire and the capacitance bridge may be metal materials with low resistivity, such as Cu, Al, Ag, Au and the like. For a coplanar waveguide, the first conductive wire may be a signal line, and the second conductive wire may be a ground line.

The first substrate of the MEMS phase shifter provided by the embodiment of the present disclosure has a first groove, and the signal line of the coplanar waveguide is suspended above the first groove. When the coplanar waveguide transmits signals, most of the signals are transmitted in the air of the first groove. Compared with the case where signals are transmitted in a substrate medium, the dielectric loss of the transmission line is significantly reduced.

Specifically, it is assumed that the material of the first substrate 100 is silicon, the materials of the first conductive wire 101 and the second conductive wires 102 are Cu, the physical length of the MEMS phase shifter (for example, the dimension along the direction D1 in FIG. 1) is 10 mm, the width of the first conductive wire 101 (for example, the dimension along the direction D2 in FIG. 1) is 2 mm, the spacing between the first conductive wire 101 and one of the second conductive wires 102 is 222 μm, and the thicknesses of the first conductive wire 101 and the second conductive wires 102 are 2.2 μm. Calculation is performed in simulation software. When a signal at a frequency of 10 Hz is transmitted in a substrate (the dielectric constant of silicon is 11.9) without a groove, the loss is 4.3 dB/m; when a signal at a frequency of 10 Hz is transmitted in a waveguide with a first groove 104 (the dielectric constant of air is 1) having a depth of 100 μm, the loss is 2.1 dB/m. It can be seen that the dielectric loss when a signal is transmitted in the air is about half of the dielectric loss when the signal is transmitted in the silicon substrate. Therefore, in the present disclosure, by arranging a first groove below the first conductive wire, most of the signals are transmitted in the air of the first groove, which can significantly reduce the dielectric loss during signal transmission. It is to be noted that the specific numerical values of length, width, spacing, depth, thickness, etc. given here are only exemplary, and a person having an ordinary skill in the art can select corresponding numerical values according to the design of the MEMS phase shifter.

In some embodiments, the MEMS phase shifter further includes a plurality of support portions being located in the first groove and configured to support the first conductive wire.

The number, position and size of the support portions may be determined according to the stress of the first conductive wire. Different frequencies of the transmitted signals correspond to different thicknesses and line widths of the first conductive wire. The first conductive wires of different thicknesses and line widths have different stresses. In practical applications, it is only required to ensure the first conductive wire is evenly suspended above the first groove as much as possible.

Each support portion may be integrated with or separated from the first substrate, as long as it can support the first conductive wire.

Figure 2:
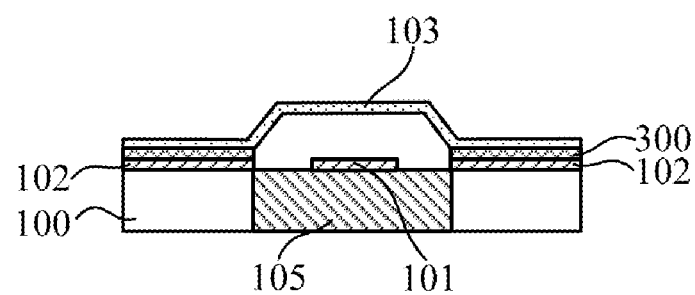
FIG. 2 is a schematic sectional view of the MEMS phase shifter in FIG. 1 taken along line AA.

Specifically, in some embodiments, the capacitance bridge may be disposed above a corresponding support portion, as shown in FIGS. 1-3. FIG. 2 and FIG. 3 are schematic sectional views of the MEMS phase shifter in FIG. 1 taken along line AA and line BB, respectively. By descending the capacitance bridge 103, the distributed capacitance can be changed to realize a phase shift. In this case, a portion of the first conductive wire 101 that is in contact with the support portion 105 may have a first width W1, a portion of the first conductive wire 101 that is located between any two adjacent support portions of the plurality of support portions 105 may have a second width W2, and the first width W1 is greater than the second width W2. A person having an ordinary skill in the art can design two widths of the first signal line at different positions in combination with the specific dimensions of the first groove 104 and the support portion 105 so as to ensure the consistency of impedance during signal transmission, thereby ensuring the signal transmission efficiency.

In the embodiment shown in FIG. 2, the first conductive wire 101 is disposed on the support portion 105, and the width of the support portion 105 spans the entire width of the first groove 104. In some embodiments, the material of the support portion 105 may be the same as the material of the first substrate 100, and they are of an integral structure. During the manufacturing process, the first substrate 100 is selectively etched to form the first groove 104, and the first substrate is retained at a position where the support portion is to be formed to form the support portion 105. In other embodiments, the material of the support portion 105 may be different from the material of the first substrate 100. During the manufacturing process, the first substrate 100 is etched to form a continuous groove along the direction D1, then a support material is deposited at a position where the support portion is to be formed to form the support portion 105, and the first groove 104 is formed accordingly.

In some embodiments, the orthographic projection of the capacitance bridge on the first surface is located between the orthographic projections of two adjacent support portions on the first surface, as shown in FIGS. 4-8.

Figure 6:
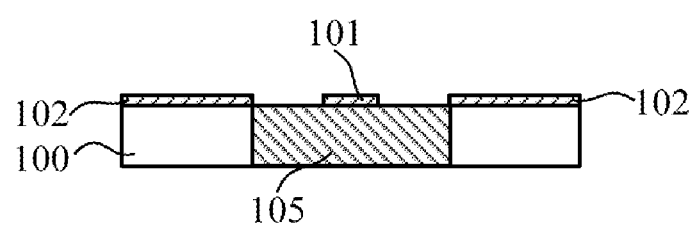
FIG. 6 is a schematic sectional view of the MEMS phase shifter in FIG. 4 taken along line DD.
Figure 7:
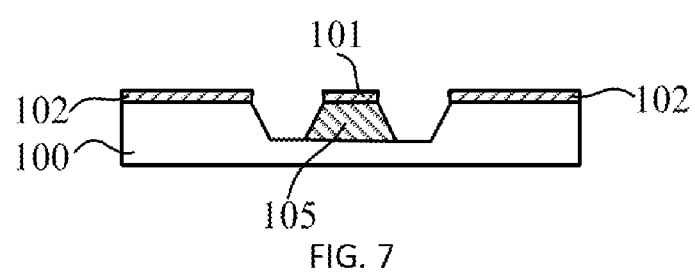
FIG. 7 is another schematic sectional view of the MEMS phase shifter in FIG. 4 taken along line DD.

The section of the MEMS phase shifter in FIG. 4 taken along, line DD may be, as shown in FIG. 6, the support portion 105 being located below the first conductive wire 202, and the width of the support portion 105 spanning the entire width of the first groove. In other embodiments, the section of the MEMS phase shifter in FIG. 4 taken along line DD may be, as shown in FIG. 7, the support portion being basically only located directly below the first conductive wire 101, that is, the support portion only occupies the middle part of the first groove 104, so that part of the signals can be transmitted in the first groove portions on two sides of the support portion. Compared with the way of disposing a support portion shown in FIG. 6, the way of disposing a support portion shown in FIG. 7 can reduce the dielectric loss during the signal transmission process more effectively. FIGS. 6 and 7 are only two exemplary ways of disposing a support portion. As stated above, the support portion only needs to enable the first conductive wire to be evenly suspended above the first groove. The specific way of disposing a support portion is not specifically limited in the present disclosure. It is to be noted that the description of the support portion 105 here is also applicable to the support portion 105 shown in FIG. 2.

Figure 8:
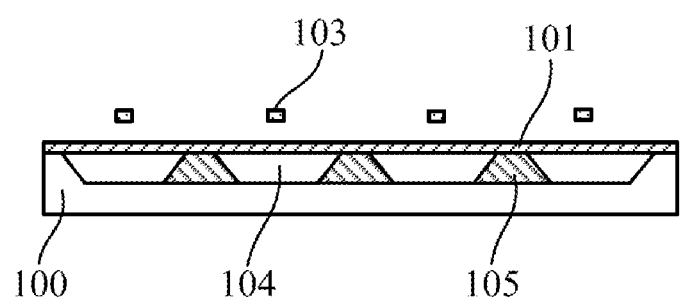
FIG. 8 is a schematic sectional view of the MEMS phase shifter in FIG. 4 taken along line EE.

FIG. 8 is a schematic sectional view of the MEMS phase shifter in FIG. 1 taken along line EE. In some embodiments, referring to FIGS. 4 and 8, a portion of the first conductive wire 101 that is in contact with the plurality of support portions 105 has a third width W3, a portion of the first conductive wire 101 that is located between any two adjacent support portions 105 of the plurality of support portions 105 and does not overlap the orthographic projection of any one of the plurality of capacitance bridges 103 on the first surface of the first substrate 100 has a fourth width W4, and a portion of the first conductive wire 101 that overlaps the orthographic projection of each of the plurality of capacitance bridges 103 on the first surface of the first substrate 100 has a fifth width W5. The third width W3 is greater than the fourth width W4, and the fourth width W4 is greater than the fifth width W5. In this case, it is possible to choose to drive the capacitance bridge or drive the first signal line based on practical situations so as to produce deformation to change the distributed capacitance, thereby realizing a phase shift. A person having an ordinary skill in the art can design three widths of the first signal line at different positions in combination with the specific dimensions of the first groove and the support portion, so as to ensure the consistency of impedance during signal transmission, thereby ensuring the signal transmission efficiency.

It is to be noted that the length of the portion of the first conductive wire having the third width is actually identical with the width of each capacitance bridge. In FIG. 1, the length of the portion of the first conductive wire 101 having the third width is shown to be slightly larger than the width of each capacitance bridge 103 only for the purpose of clearly illustrating the widths of the first conductive wire 101 at different positions, which does not represent a limitation to the present disclosure.

According to the radio frequency design experience, the width of an electromagnetic signal of the transmission line is generally 1.5 times the width of the signal line. Therefore, in some embodiments, in a plane parallel to the first surface 110 of the first substrate 100, the width of the first groove 104 in a direction (the direction D2 in FIG. 1) perpendicular to the first conductive wire may be 3-6 times the above-mentioned fourth width to ensure that the electromagnetic signal is mainly transmitted in the air medium.

When the depth of the first groove 104 is greater than 10 μm, the loss of the MEMS phase shifter is significantly reduced. If the process conditions permit, under the premise of ensuring the integrity of the device, the deeper the depth of the first groove 104 is, the lower the loss of the MEMS phase shifter will be. In some embodiments, the depth of the first groove 104 is greater than 100 μm, greater than 150 μm, or even greater than 200 μm.

It is to be noted that the description of the first groove 104 here is also applicable to the first groove 104 in the embodiment of FIGS. 1-3.

Figure 9:
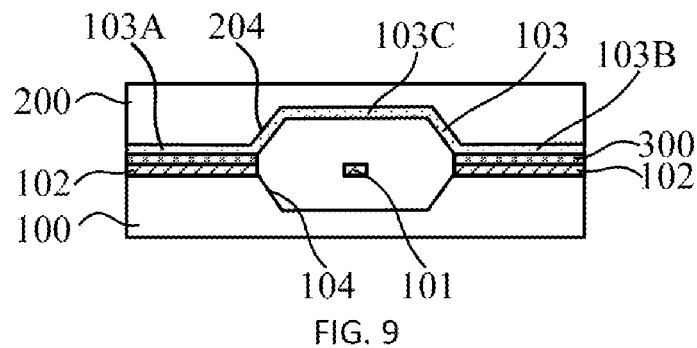
FIG. 9 is a schematic sectional view of a further MEMS phase shifter according to an embodiment of the present disclosure.

In some embodiments, as shown in FIG. 9, the MEMS phase shifter may further include an insulating layer 300 disposed on the second conductive wires 102. Each capacitance bridge 103 includes a first end portion 103A, a second end portion 103B and an intermediate portion 103C therebetween, and the first end portion 103A and the second end portion 103B are disposed on the insulating layer 300.

In some embodiments, as shown in FIG. 9, the MEMS phase shifter may further include a second substrate 200 disposed opposite to the first substrate. The second substrate 200 has a second surface facing the first substrate, the second surface includes a second groove 204, and the intermediate portion 103C of each capacitance bridge 103 is disposed in the second groove 204.

In the embodiment where the capacitance bridge is fabricated in the second groove of the second substrate, the capacitance bridge and the suspended first conductive wire form a distributed capacitance. The first conductive wire is driven by static electricity to produce deformation, which further changes the magnitude of the distributed capacitance, so that the transmission line forms a slow-wave structure, and the signal transmission produces a phase change to achieve a phase shift effect. This prevents the phase shift degree from becoming smaller after fatigue of the capacitance bridge. In addition, the second substrate also plays the role of packaging, which eliminates the subsequent packaging process of the device, and avoids the introduction of stresses that affect the phase shift from the subsequent packaging. The phase shifter has a low loss, stable structure and high integration, which prevents the mechanical fatigue of the capacitance bridge from affecting the phase shifting effect, and significantly reduces the loss and error resulting from packaging.

Figure 10:
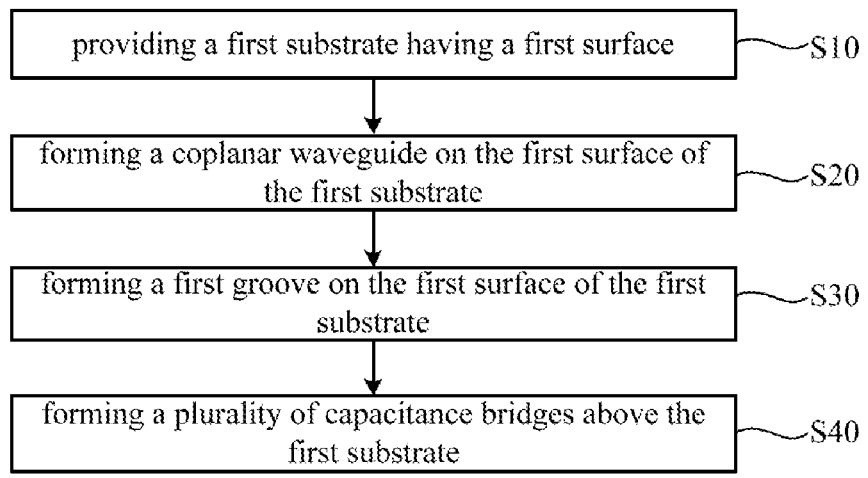
FIG. 10 is a flow chart of a method of manufacturing an MEMS phase shifter according to an embodiment of the present disclosure.

According to another aspect of the present disclosure, there is provided a method of manufacturing the MEMS phase shifter as described above. As shown in FIG. 10, the method may include the following steps S10, S20, S30 and S40.

Figure 11A:
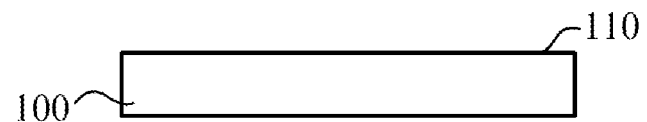
FIGS. 11A, 11B, 11C, 11D, 11E, 11F and 11G are schematic structural views of specific steps for manufacturing an MEMS phase shifter according to an embodiment of the present disclosure.

S10: providing a first substrate 100 having a first surface 110, as shown in FIG. 11A.

Figure 11B:
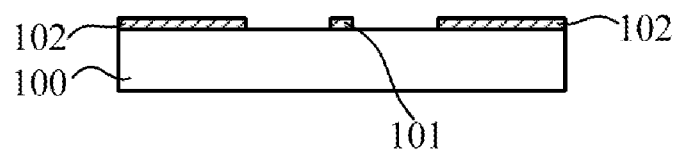

S20: forming a coplanar waveguide on the first surface of the first substrate 100. As shown in FIG. 11B, the coplanar waveguide includes a first conductive wire 101 and two second conductive wires 102 located on two sides of the first conductive wire 101 respectively and insulated from the first conductive wire.

S30: forming a first groove 104 on the first surface of the first substrate 100. As shown in FIG. 11D, the first conductive wire 101 is suspended above the first groove 104.

S40: forming a plurality of capacitance bridges 103 above the first substrate 100. As shown in FIG. 2 or 5, the plurality of capacitance bridges are arranged at intervals and insulated from the first conductive wire 101 and the second conductive wires 102, and each of the plurality of capacitance bridges 103 is disposed in an intersecting manner with the first conductive wire 101.

The first substrate of the MEMS phase shifter manufactured by this method has a first groove, and the signal line of the coplanar waveguide is suspended above the first groove. When the coplanar waveguide transmits signals, most of the signals are transmitted in the air of the first groove. Compared with the case where signals are transmitted in a substrate medium, the dielectric loss of the transmission line is significantly reduced.

In some embodiments, step S20 of forming a coplanar waveguide on the first surface of the first substrate may include: forming a first metal layer on the first surface of the first substrate; patterning the first metal layer to form the first conductive wire and the two second conductive wires.

Figure 11C:
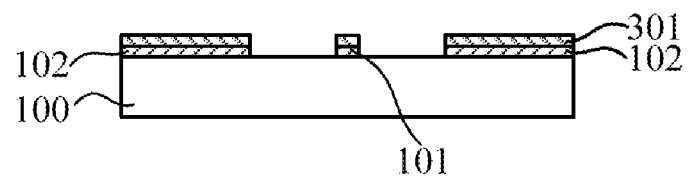
Figure 11D:
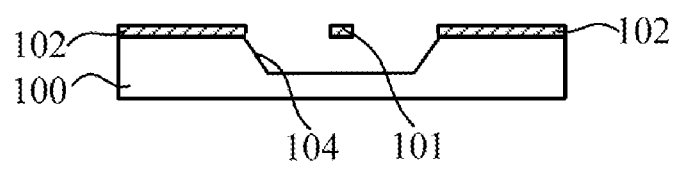

In some embodiments, step S30 of forming a first groove on the first surface of the first substrate may include: coating a protective layer on the first surface of the first substrate; patterning the protective layer so that a patterned protective layer 301 only covers the first conductive wire 101 and the two second conductive wires 102, as shown in FIG. 11C; etching a portion of the first surface of the first substrate that is not covered by a protective stack formed by the patterned protective layer, the first conductive wire and the second conductive wires so as to form the first groove 104, as shown in FIG. 11D.

In some embodiments, etching a portion of the first surface of the first substrate that is not covered by the protective stack may include: selectively etching a portion of the first surface of the first substrate that is not covered by the protective stack to form the first groove and a plurality of support portions in the first groove for supporting the first conductive wire.

The material of the protective layer may be a material that has a strong structure, is easy to release, and is not affected by the etching solution, such as silicon oxide, polysilicon, photoresist, polymer, etc.

In some embodiments, prior to forming the plurality of capacitance bridges above the first substrate, the method may further include: forming an insulating layer on the two second conductive wires.

Figure 11E:
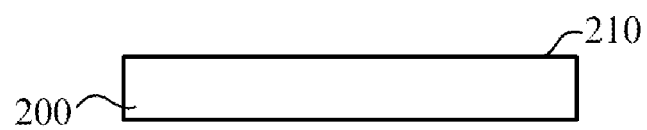
Figure 11F:
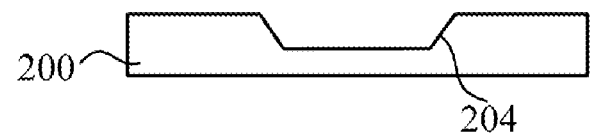
Figure 11G:
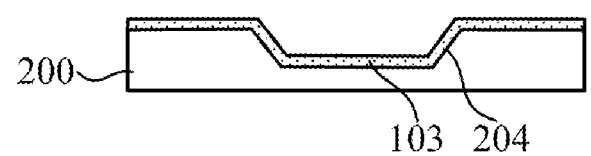

In some embodiments, forming a plurality of capacitance bridges above the first substrate may include: providing a second substrate 200 having a second surface 210, as shown in FIG. 11E; forming a second groove 204 on the second surface of the second substrate 200, as shown in FIG. 11F; forming a plurality of capacitance bridges 103 arranged at intervals on the second surface of the second substrate 200, as shown in FIG. 11G; assembling the second substrate 200 with the first substrate 100 with the first surface facing the second surface to form an MEMS phase shifter as shown in FIG. 9. Each capacitance bridge 103 includes a first end portion 103A, a second end portion 103B, and an intermediate portion 103C therebetween, the first end portion 103A and the second end portion 103B are located on the insulating layer 300, and the intermediate portion 103C is located in the second groove 204.

In some embodiments, forming a plurality of capacitance bridges arranged at intervals on the second surface of the second substrate includes: forming a second metal layer on the second surface of the second substrate; patterning the second metal layer to form a plurality of capacitance bridges arranged at intervals.

In the MEMS phase shifter fabricated by the above method, the capacitance bridge is fabricated in the second groove of the second substrate. The capacitance bridge and the suspended first conductive wire form a distributed capacitance. The first conductive wire is driven by static electricity to produce deformation, which further changes the magnitude of the distributed capacitance, so that the transmission line forms a slow-wave structure and the signal transmission produces a phase change to achieve a phase shift effect. This prevents the phase shift degree from becoming smaller after fatigue of the capacitance bridge. In addition, the second substrate also plays the role of packaging, which eliminates the subsequent packaging process of the device, and avoids the introduction of stresses that affect the phase shift from the subsequent packaging. The phase shifter has a low loss, stable structure and high integration, which prevents the mechanical fatigue of the capacitance bridge from affecting the phase shift effect, and significantly reduces the loss and errors resulting from packaging.

For the foregoing method embodiments, to facilitate description, they are all expressed as a series of action combinations, but a person having an ordinary skill in the art should be aware that the present disclosure is not limited by the described order of actions, because some steps may be performed in other orders or simultaneously according to the present disclosure. Secondly, a person having an ordinary skill in the art should also be aware that the embodiments described in the specification are all optional embodiments, and the actions involved are not necessary to the present disclosure.

For clarity, in the drawings used to describe the embodiments of the present disclosure, the thicknesses and sizes of layers or microstructures are exaggerated. It can be understood that when an element such as a layer, line, region or substrate is referred to as being "above" or "below" another element, the element may be "directly" located "above" or "below" the other element, or there may be intermediate elements.

Unless otherwise defined, the technical terms used in the embodiments of the present disclosure should have common meanings understood by a person having an ordinary skills in the field to which the present disclosure pertains. The "first", "second" and similar words used in the embodiments of the present disclosure do not indicate any order, quantity, or importance, but are only used to distinguish different components. The expressions such as "upper", "lower", "left" and "right" are only used to indicate a relative positional relationship. When the absolute position of an object being described changes, the relative positional relationship may also change accordingly.

What have been stated above are only specific embodiments of the present disclosure, but the protection scope of the present disclosure is not limited thereto. Any variations or substitutions that can be easily conceived by those skilled in the art familiar with this technical field within the technical scope revealed by the present disclosure should be encompassed within the protection scope of the present disclosure. Thus, the protection scope of the present disclosure should be based on the protection scope of the claims. By studying the drawings, the disclosure and the appended claims, a person having an ordinary skill in the art can understand and achieve other modifications to the disclosed embodiments when practicing the claimed invention. In the claims, the wording "comprising" does not exclude other elements or steps, and the terms such as "a", "an" and "the" in the singular do not exclude the plural. The mere fact that certain measures are recited in mutually different dependent claims does not indicate that a combination of these measures cannot be used to advantage. Any reference signs in the claims should not be construed as limiting the scope.

What is claimed is:

1. A MEMS phase shifter, comprising:
a first substrate having a first surface;
a coplanar waveguide on the first surface of the first substrate, and comprising a first conductive wire and two second conductive wires that are on two sides of the first conductive wire respectively and insulated from the first conductive wire; and
a plurality of capacitance bridges on a side of the coplanar waveguide away from the first substrate, the plurality of capacitance bridges being arranged at intervals and insulated from the first conductive wire and the second conductive wires,
wherein each of the plurality of capacitance bridges intersects the first conductive wire,
wherein the first surface of the first substrate comprises a first groove, and the first conductive wire is suspended above the first groove, and
wherein the MEMS phase shifter further comprises a plurality of support portions in the first groove and configured to support the first conductive wire.

2. The MEMS phase shifter according to claim 1, wherein an orthographic projection of each of the plurality of capacitance bridges on the first surface overlaps a respective one of orthographic projections of the plurality of support portions on the first surface.

3. The MEMS phase shifter according to claim 2, wherein a portion of the first conductive wire that is in contact with at least one of the plurality of support portions has a first width, a portion of the first conductive wire that is between any two adjacent support portions of the plurality of support portions has a second width, and the first width is greater than the second width.

4. The MEMS phase shifter according to claim 1, wherein an orthographic projection of each of the plurality of capacitance bridges on the first surface is -between orthographic projections of two adjacent support portions of the plurality of support portions on the first surface.

5. The MEMS phase shifter according to claim 4, wherein a portion of the first conductive wire that is in contact with the plurality of support portions has a third width, a portion of the first conductive wire that is between any two adjacent support portions of the plurality of support portions and does not overlap an orthographic projection of any one of the plurality of capacitance bridges on the first surface has a fourth width, a portion of the first conductive wire that overlaps the orthographic projection of each of the plurality of capacitance bridges on the first surface has a fifth width, and
wherein the third width is greater than the fourth width, and the fourth width is greater than the fifth width.

6. The MEMS phase shifter according to claim 5, wherein in a plane parallel to the first surface, a width of the first groove in a direction perpendicular to the first conductive wire is 3-6 times the fourth width.

7. The MEMS phase shifter according to claim 4, further comprising:
an insulating layer on the second conductive wires,
wherein each of the plurality of capacitance bridges comprises a first end portion, a second end portion, and an intermediate portion therebetween, and the first end portion and the second end portion are on the insulating layer.

8. The MEMS phase shifter according to claim 7, further comprising:
a second substrate opposite to the first substrate,
wherein the second substrate has a second surface facing the first substrate, the second surface comprises a second groove, and the intermediate portion of each of the plurality of capacitance bridges is in the second groove.

9. The MEMS phase shifter according to claim 1, wherein orthographic projections of the first groove, the first conductive wire, and the second conductive wires on the first surface of the first substrate extend along a first direction, orthographic projections of the plurality of capacitance bridges on the first surface of the first substrate extend along a second direction, and the second direction is perpendicular to the first direction.

10. A method of manufacturing a MEMS phase shifter, comprising:
providing a first substrate having a first surface;
forming a coplanar waveguide on the first surface of the first substrate, the coplanar waveguide comprising a first conductive wire and two second conductive wires on two sides of the first conductive wire respectively and insulated from the first conductive wire;
forming a first groove on the first surface of the first substrate, the first conductive wire being suspended above the first groove; and
forming a plurality of capacitance bridges above the first substrate, the plurality of capacitance bridges being arranged at intervals and insulated from the first conductive wire and the second conductive wire,
wherein each of the plurality of capacitance bridges intersect the first conductive wire,
wherein forming the coplanar waveguide on the first surface of the first substrate comprises:
forming a first metal layer on the first surface of the first substrate; and
patterning the first metal layer to form the first conductive wire and the two second conductive wires,
and wherein forming the first groove on the first surface of the first substrate comprises:
coating a protective layer on the first surface of the first substrate;
patterning the protective layer so that a patterned protective layer covers the first conductive wire and the two second conductive wires; and
etching a portion of the first surface of the first substrate that is not covered by a protective stack formed by the patterned protective layer, the first conductive wire and the second conductive wires to form the first groove.

11. The method according to claim 10, wherein etching a portion of the first surface of the first substrate that is not covered by a protective stack formed by the patterned protective layer, the first conductive wire and the second conductive wires to form the first groove comprises:
selectively etching a portion of the first surface of the first substrate that is not covered by the protective stack to form the first groove and a plurality of support portions in the first groove for supporting the first conductive wire.

12. The method according to claim 11, wherein forming a plurality of capacitance bridges above the first substrate comprises:

forming the plurality of capacitance bridges so that an orthographic projection of each of the plurality of capacitance bridges on the first surface overlaps a respective one of orthographic projections of the plurality of support portions on the first surface.

13. The method according to claim 11, wherein forming a plurality of capacitance bridges above the first substrate comprises:

forming the plurality of capacitance bridges so that an orthographic projection of each of the plurality of capacitance bridges on the first surface is between orthographic projections of two adjacent support portions of the plurality of support portions on the first surface.

* * * * *